United States Patent [19]

Nakamura et al.

[11] 4,034,396
[45] July 5, 1977

[54] LIGHT SENSOR HAVING GOOD SENSITIVITY TO VISIBLE LIGHT

[75] Inventors: Tetsuro Nakamura; Hideaki Suzuki, both of Tokyo, Japan

[73] Assignee: Nippon Electric Company, Ltd., Tokyo, Japan

[22] Filed: May 22, 1975

[21] Appl. No.: 579,848

[30] Foreign Application Priority Data

May 24, 1974 Japan .............................. 49-59178

[52] U.S. Cl. .............................. 357/30; 250/211 J; 357/16; 357/61
[51] Int. Cl.² .......................................... H01L 27/14
[58] Field of Search .................... 357/30; 250/211 J

[56] References Cited

UNITED STATES PATENTS

| 3,403,284 | 9/1968 | Buck et al. ........................ 250/211 J |
| 3,548,213 | 12/1970 | Owen et al. ........................... 357/30 |
| 3,560,812 | 2/1971 | Hall ................................... 357/30 |
| 3,563,817 | 2/1971 | Chang et al. ......................... 357/30 |
| 3,614,549 | 10/1971 | Lorenz et al. ........................ 357/16 |
| 3,675,026 | 7/1972 | Woodall .............................. 357/30 |
| 3,769,558 | 10/1973 | Lindmayer ........................... 357/30 |

Primary Examiner—William D. Larkins
Assistant Examiner—Marcus S. Rasco
Attorney, Agent, or Firm—Hopgood, Calimafde, Kalil, Blaustein & Lieberman

[57] ABSTRACT

A light sensor includes a body of semiconductor material having an energy gap within the range of between 1.65 eV and 2.0 eV and a main surface. A rectifying junction is formed in the body of semiconductor material at a depth of at most 1.5 microns beneath the main surface. The semiconductor material of such a device is preferably selected from a group of materials consisting of $Ga\,As_{1-x}\,P_x$ with a value of $x$ in the range between 0.20 and 0.52 and $Ga_{1-x}\,Al_x\,As$ having a value of $x$ in the range between 0.20 and 0.68.

4 Claims, 4 Drawing Figures

LIGHT SENSOR HAVING GOOD SENSITIVITY TO VISIBLE LIGHT

BACKGROUND OF THE INVENTION

This invention relates to light sensors, and more particularly to photosensitive devices utilizing a photovoltage effect, such as photodiodes.

Silicon and germanium photodiodes have been known. Such conventional photodiodes have either a PN junction formed by an impurity diffused region or a surface barrier formed by metal-to-semiconductor contacts. When photodiodes are exposed to a light, some pairs of electrons and holes are produced causing current to flow through the PN junction or the surface barrier. This is called the photovoltage effect.

The photo-sensitivity of such photodiodes lies within a spectrum ranging from visible to near-infrared wavelengths. Therefore, to enable this conventional photodiode to be sensitive only to the visible spectrum of light, an infrared filter capable of absorbing radiation having wavelengths longer than about 750 nm has had to be placed in front of the photodiode. Typically, this filter comprises either an infrared absorbing glass such as borosilicate glass which includes metal ions such as $Fe_3^+$ and/or the like, or an infrared reflecting filter constituted of a glass substrate and multi layers piled up alternately on such substrate comprising two kind of interference films, one of which is a high refractive index material such as ZnS and the other of which is a low refractive index material such as MgF, or the filter may be a combination of the above two filters. Such filter is indispensable if the conventional photodiode is to be applied to a camera for automatic control of exposure. With this filter, however, it has been virtually impossible to obtain a stable infrared filtering effect and visible light transmission characteristics and to provide a photodiode of of reduced cost. Furthermore, the use of such a filter has resulted in an undesirable addition to the size of the photodiodes.

Another drawback involved in the conventional photodiode is its inability to measure dim light because the light-to-dark current ratio of such a device is less than 600 for illumination of one lux. or under. The above has been derived from experimental results which demonstrated that the leakage current (or dark current) which flowed when a reverse bias-voltage of 2 to 3 V was applied to a conventional photodiode in the absence of light at room temperature was larger than 200 $PA/cm^2$, while the light current which flowed in such a device under illumination of one lux from a light source having a spectrum equal to the radiation spectrum of a black-body of 2854° K was 120 $nA/cm^2$ at most.

Therefore, it is a principal object of the invention to provide a light sensor which is sensitive only to a specific spectrum of radiation, has uniform spectral sensitivity, can be constructed in a small size and can be manufactured at low costs.

It is another object of the invention to provide a light sensor capable of markedly reducing the dark current and thus offering a greater light-to-dark current ratio.

It is still another object of the invention to provide a light sensor sensitive to visible light or to light having a wavelength of from 350 to 750 nm.

SUMMARY OF THE INVENTION

With these and other objects in view, this invention provides a light sensor constituted of a semiconductor body having an energy gap in a range between 1.65 eV and 2.0 eV and a rectifying junction formed within the semiconductor body at a depth of less than 1.5 microns from the surface of the body.

The threshold wavelength ($\lambda$) of such a sensor on the long-wavelength side is determined by the following equation (1)

$$\lambda \text{ (nm)} = 1240/Eg(eV) \qquad (1)$$

where Eg denotes the energy gap of semiconductor material. Therefore, the light sensor according to this invention is not sensitive to the light of a wavelength longer than 750 nm for a semiconductor material having an energy gap Eg of 1.65 eV. In the case of a semiconductor material having an energy gap Eg of 2.0 eV, the longer limit of the wavelength sensitive of the resulting light sensor is 620 nm. In other words, the light sensor of this invention is not sensitive to radiation having a longer wavelength than that of visible light.

As such semiconductor substances, $Ga\ As_{1-x}\ P_x$, where $x$ is between 0.02 and 0.52, and $Ga_{1-x}\ Al_x\ As$, where $x$ is between 0.20 and 0.68, are preferable. These substances strongly absorb radiation having a wavelength shorter than 350 nm to provide a selective sensitivity to the visible light spectrum.

Specifically, to simulate the sensitivity of a light sensor to the luminosity factor of the human eye, the energy gap Eg of the material should be selected in a range between 1.80 eV and 2.0 eV. This condition corresponds to $Ga\ As_{1-x}\ P_x$ having a value of $x$ in a range of between 0.32 and 0.52 and $Ga_{1-x}\ Al_x\ As$ having a value of $x$ in a range of between 0.30 and 0.68.

The sensitivity to light of such a light sensor is extremely high. Light intensity is remarkably reduced at deeper portions of the semiconductor body, so that, as the position of PN junctions is formed closer to the surface of the body, the number of carriers increases in the semiconductor material, thereby causing the light sensor to be more sensitive. In fact, our experience has shown that a highly sensitive sensor is obtained where the depth of PN junction is selected to be less than 1.5 microns beneath the surface of the body. To prevent the decrease of the sensitivity and an increase of the dark current of the device based on surface damage, the depth of the junction should preferably be selected in the range between 0.1 micron and 1.0 micron and a particularly favorable range is between 0.2 to 0.7 micron.

A light sensor made according to this invention allows very little dark current. This is based on the fact that the number of thermally excited minority carriers is the inverse proportion to the energy gap of the semiconductor material.

As further feature, the device of this invention is compact, because no filter is needed. The surface stability is superior, because a semiconductor having a high energy gap has little inversion layer at its surface.

DESCRIPTION OF THE DRAWINGS

The other features and advantages of the invention will become more apparent from the following detailed description taken in conjunction with the accompanying drawings, wherein.

DESCRIPTION OF THE INVENTION

Figure 1:
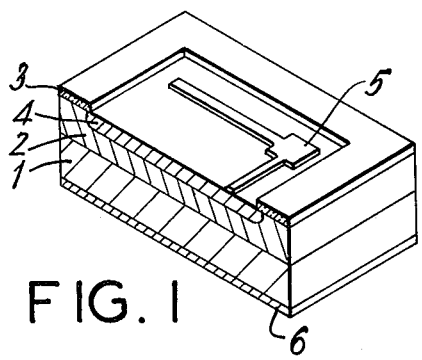
FIG. 1 is a partially sectional perspective view showing the construction of a first embodiment of this invention.

Referring now to FIG. 1, an N-type single crystal Ga As substrate 1 having a specific resistance of 0.005Ω-cm, has an N-type single crystal layer 2 of GaAs $_{0.62}$P$_{0.38}$, a material of the type Ga As$_{1-x}$ P$_x$, having an electron density of $1\times10^{17}$cm$^{-3}$ formed on its surface to a thickness of 80μm. A P-type region 4 having zinc as an acceptor is provided in the layer 2, causing the P-N junction to be formed at 0.4 microns in depth beneath the surface of the layer 2. An electrode 5 of aluminum is evapolated onto the region 4, while a cathode 6, which may be composed of Au(90%)–Ge(10%) alloy, is formed on the opposed surface of the substrate 1. A passivation layer 3 of SiN covers the layer 2 except for the region 4.

The photodiode will generate a current in the presence of light having an energy higher than the energy gap Eg of the semiconductor material of which the photodiode is composed. The energy of the light can be expressed by the equation hc/λ (where h denotes Plank's constant, c is the velocity of light and λ is the wavelength of the light). The energy gap Eg of Ga AsO.62PO.38 is 1.88 eV. Therefore, the threshold wavelength on the long wavelength side of a photodiode made of this material is estimated from equation (1) to be within the visible region of the spectrum comprising wavelengths shorter than 659 nm.

In that portion of the spectrum comprising wavelengths shorter than 350 nm on the short wavelength side of the visible spectrum region, a considerable part of light incident upon the photosensitive device will be absorbed by the semiconductor Ga As$_{1-x}$ P$_x$ itself. This, together with providing a coating on the surface of the device comprising a resin such as silicone and epoxy resin, will make the photosensitivity in this spectral region negligible small.

Figure 2:
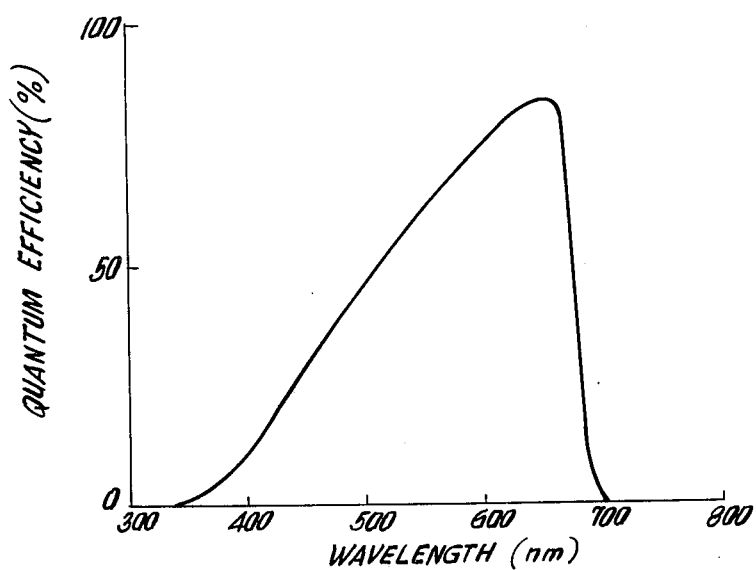
FIG. 2 is a graphic diagram showing the spectral sensitivity of the photodiode shown in FIG. 1.

The spectral sensitivity of such a device is shown in FIG. 2 where the ordinate and the abscissa show respectively quantum efficiency and wavelength. Thus the resulting photodiode is sensitive only to visible light within a range of wavelengths of between 400 nm and 680 nm.

Figure 3:
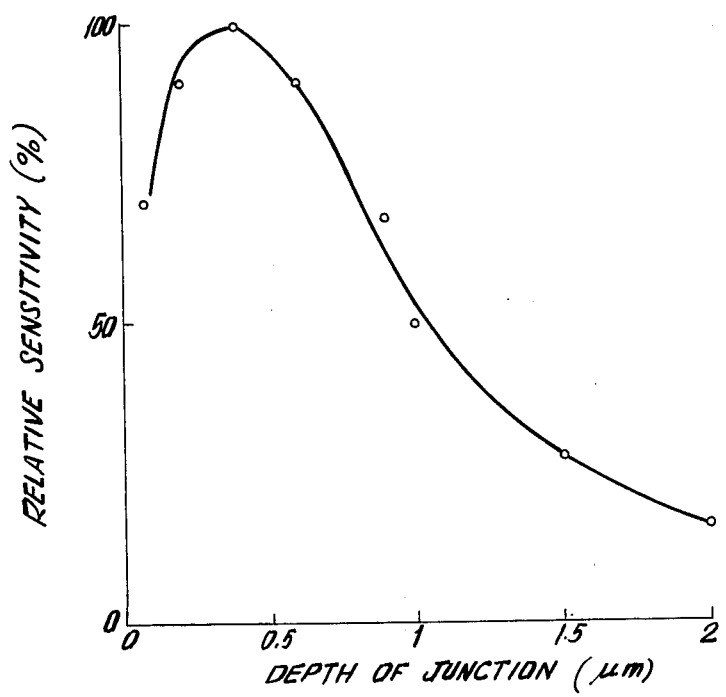
FIG. 3 is a graphic diagram showing the relation of sensitivity versus junction depth.

The sensitivity of a photodiode (i.e., the light current per unit illumination), greatly depends on the depth of the PN junction formed in the device. FIG. 3 shows the relationship between relative sensitivity and the depth of PN junction when light having a wavelength of 550 nm is applied to the photodiode of the first embodiment described above. Referring now to FIG. 3, the sensitivity of such a device has a peak value when the depth of the PN junction is approximately 0.4 micron beneath the surface of the device. At depths greater than 1.5 microns, the sensitivity decreases rapidly, while at depths shallower than 0.1 micron, it is difficult to obtain photodiodes having no damage at the PN junction, which damage results in a decrease of the sensitivity and an increase of the dark current of the photodiode. Thus, it is technically preferable to select the depth of PN junction to be within the range of between 0.1 micron and 1.0 micron, and particularly within the range of between 0.2 micron and 0.7 micron.

The photodiode of the first embodiment described above has a low dark current and good surface stability as mentioned above.

The manufacturing method for a photodiode of the first embodiment will now be described. The N-type single crystal layer 2 of Ga AsP.62PO.38 having an electron density of $1\times10^{17}$ cm$^{-3}$ is epitaxially grown to a thickness of 80 microns on the N-type single crystal Ga As substrate 1 which has a specific resistance of 0.005 Ω-cm.

The silicon nitride film 3, which is 1200 A in thickness is found on the layer 2 at a temperature of 610° C by chemical vapor deposition technique. A 1.0 × 1.0 mm$^2$ opening is formed in the SiN film 3 by a plasma etching technique using an etching mask of resin made by a photoetching technique.

A silicon dioxide film, 2000 A thick, is then formed on the entire surface of the crystal including the opening. This step decreases the doping impurity concentration resulting from the following doping process and provides a planar surface of the PN junction and an even depth for the junction. The resulting low impurity concentration has low light absorbtion. The element thus produced, together with 20 mg of zinc whose purity is greater than 99.999%, is placed in a high purity quartz tube, which is then evacuated to a vacuum of 1 × 10$^{-6}$ mmHg or less. The tube is sealed off at a volume of 100 cm$^3$. This quartz tube, before enclosing the crystal and zinc, is subjected to pre-baking at 1100° C for two hours during the exhausting of air. The sealed tube is then placed in a furnace and heated to 730° C for 30 minutes to cause zinc to be diffused into the region of the opening. The resultant diffusion layer 4 has an impurity concentration of 5 × 10$^{19}$ cm$^{-3}$ and is about 0.4 μm thick.

After the diffusion process the SiO$_2$ film is removed from the opening area. An aluminum electrode 5 is then formed therein by aluminum deposition and photoetching techniques. The total thickness of the substrate 1 and the layer 2 is adjusted to about 250 μm by polishing the back surface of the substrate 1. An electrode 6 1 is then bonded to the surface of substrate opposed to that on which layer 2 was formed by vapor-depositing AuGe in which Ge is 10% by weight.

A wafer comprising many photodiode chips formed by the above process is divided into 1.2 × 1.2 mm pieces. These chips are respectively packaged in metal can cases.

Figure 4:
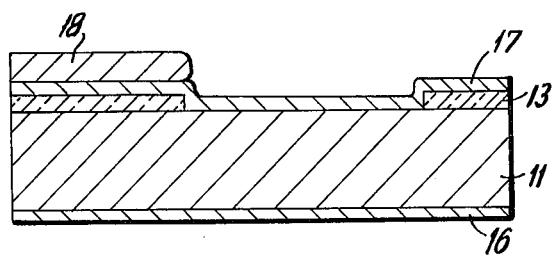
FIG. 4 is a sectional view of a second embodiment of this invention.

Referring now to FIG. 4, a second embodiment of this invention is disclosed having a surface barrier which is produced by a metal-semiconductor contact, which is so-called Schottky barrier.

On a substrate 11 of N-type Ga As$_{0.62}$PO$_{0.38}$ having an electron concentration of 1 × 10$^{17}$ cm$^{-3}$, a silicon nitride layer 13 having an opening is disposed to a thickness of 1,200 A. A palladium layer 17 is evaporated to a thickness of 100A over both the silicon nitride layer 13 and the exposed region of the substrate 11. An electrode 18 of gold is then evaporated to a thickness of 1 micron on region of the palladium layer 17 located on the silicon nitride layer 13. The opposed back surface of the substrate 11 has an electrode 16 of AuGe, which is preferably 90% by weight of gold and 10% by weight of Germanium attached thereto.

This embodiment shows a little increase of dark current as compared to the first embodiment, but has a surface stability which is comparable to the first embodiment.

Two preferred embodiments of the invention have been described above. It is apparent, however, that many modifications may be made on the disclosed particulars. For example, the semiconductor crystal material is not limited to Ga $As_{0.62}P_{0.38}$ but may be other III–V compound semiconductors of the type Ga $As_{1-x} P_x$ having a value of $x$ ranging from 0.20 to 0.52 or of the type $Ga_{1-x} Al_x$ As having a value of $x$ ranging from 0.20 to 0.68.

What is claimed is:

1. A radiation sensing device for sensing visible light including
    a semiconductor substrate of one conductivity type having an energy gap, said energy gap being between 1.80 eV and 2.0 eV and said semiconductor substrate being formed of Ga $As_{1-x} P_x$ in which $x$ has a value between 0.32 and 0.52;
    a region of an opposite conductivity type which is formed in one surface of said substrate and extends to a depth of between 0.1 micron and 1.0 micron beneath said one surface;
    a first electrode which is electrically connected to said region; and
    a second electrode which is electrically connected to said substrate whereby an electric current flows between said first and second electrodes when said region is exposed to said visible light.

2. A radiation sensing device as claimed in claim 1 in which said region extends to a depth of between 0.2 micron to 0.7 micron beneath said one surface.

3. A radiation sensing device for sensing visible light including
    a semiconductor substrate of one conductivity type having an energy gap, said energy gap being between 1.80 eV and 2.0 eV and said semiconductor substrate being formed of $Ga_{1-x} Al_x$ As in which $x$ has a value between 0.30 and 0.68;
    a region of an opposite conductivity type which is formed in one surface of said substrate and extends to a depth of between 0.1 micron and 1.0 micron beneath said one surface;
    a first electrode which is electrically connected to said region; and
    a second electrode which is electrically connected to said substrate whereby an electric current flows between said first and second electrodes when said region is exposed to said visible light.

4. A radiation sensing device as claimed in claim 3 in which said region extends to a depth of between 0.2 micron to 0.7 micron beneath said one surface.

* * * * *